United States Patent
Tobioka

(10) Patent No.: US 9,425,047 B1
(45) Date of Patent: Aug. 23, 2016

(54) SELF-ALIGNED PROCESS USING VARIABLE-FLUIDITY MATERIAL

(71) Applicant: SanDisk Technologies Inc., Plano, TX (US)

(72) Inventor: Akihiro Tobioka, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/626,652

(22) Filed: Feb. 19, 2015

(51) Int. Cl.
| | |
|---|---|
| H01L 21/425 | (2006.01) |
| H01L 21/027 | (2006.01) |
| H01L 21/768 | (2006.01) |
| H01L 21/266 | (2006.01) |
| H01L 21/311 | (2006.01) |
| H01L 27/115 | (2006.01) |
| H01L 21/02 | (2006.01) |
| H01L 21/3213 | (2006.01) |

(52) U.S. Cl.
CPC ..... *H01L 21/0274* (2013.01); *H01L 21/02282* (2013.01); *H01L 21/266* (2013.01); *H01L 21/31144* (2013.01); *H01L 21/32139* (2013.01); *H01L 21/76802* (2013.01); *H01L 21/76892* (2013.01); *H01L 27/11524* (2013.01)

(58) Field of Classification Search
USPC .......... 438/530, 618, 702, 703, 696
See application file for complete search history.

(56) References Cited

U.S. PATENT DOCUMENTS

| | | | |
|---|---|---|---|
| 5,570,315 A | 10/1996 | Tanaka et al. | |
| 5,768,192 A | 6/1998 | Eitan | |
| 5,774,397 A | 6/1998 | Endoh et al. | |
| 5,887,145 A | 3/1999 | Harari et al. | |
| 6,011,725 A | 1/2000 | Eitan | |
| 6,046,935 A | 4/2000 | Takeuchi et al. | |
| 6,429,123 B1 | 8/2002 | Tseng | |
| 6,894,341 B2 | 5/2005 | Sugimae et al. | |
| 7,291,560 B2 | 11/2007 | Parascandola et al. | |
| 7,495,294 B2 | 2/2009 | Higashitani | |
| 7,951,669 B2 | 5/2011 | Harari et al. | |
| 7,985,682 B2 | 7/2011 | Matsuzaki | |
| 8,158,333 B2 | 4/2012 | Hashimoto | |
| 8,194,470 B2 | 6/2012 | Higashitani | |
| 8,227,354 B2 | 7/2012 | Kim et al. | |
| 8,557,704 B2 | 10/2013 | Wells et al. | |
| 2006/0216938 A1 | 9/2006 | Miyagawa et al. | |
| 2006/0234166 A1 | 10/2006 | Lee et al. | |
| 2007/0026684 A1 | 2/2007 | Parascandola et al. | |
| 2008/0131793 A1 | 6/2008 | Lee et al. | |
| 2010/0120247 A1 | 5/2010 | Park | |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Timor Karimy
(74) *Attorney, Agent, or Firm* — Davis Wright Tremaine LLP

(57) ABSTRACT

A method of forming a wide line includes forming a portion of variable-fluidity material between opposing inner walls of a pair of adjacent line portions, the portion of variable-fluidity material patterned to have a lateral dimension that is smaller than a distance between the opposing inner walls of the pair of adjacent line portions, and subsequently applying process conditions that increase the fluidity of the portion of variable-fluidity material sufficiently to cause the portion of variable-fluidity material to extend to the opposing inner walls of the pair of adjacent line portions.

20 Claims, 7 Drawing Sheets

(56) References Cited

U.S. PATENT DOCUMENTS

| | | |
|---|---|---|
| 2010/0155813 A1 | 6/2010 | Murata et al. |
| 2010/0173492 A1 | 7/2010 | Kim et al. |
| 2011/0104899 A1 | 5/2011 | Lam et al. |
| 2012/0085733 A1 | 4/2012 | Mebarki et al. |
| 2012/0168841 A1 | 7/2012 | Chen et al. |
| 2012/0208361 A1 | 8/2012 | Ha |
| 2013/0065397 A1 | 3/2013 | Chen |
| 2014/0080299 A1 | 3/2014 | Sel et al. |

OTHER PUBLICATIONS

Chen et al., "Self-Aligned Triple Patterning to Extend Optical Lithography for 1x Patterning," International Symposium on Lithography Extensions, Oct. 21, 2010, 20 pages.

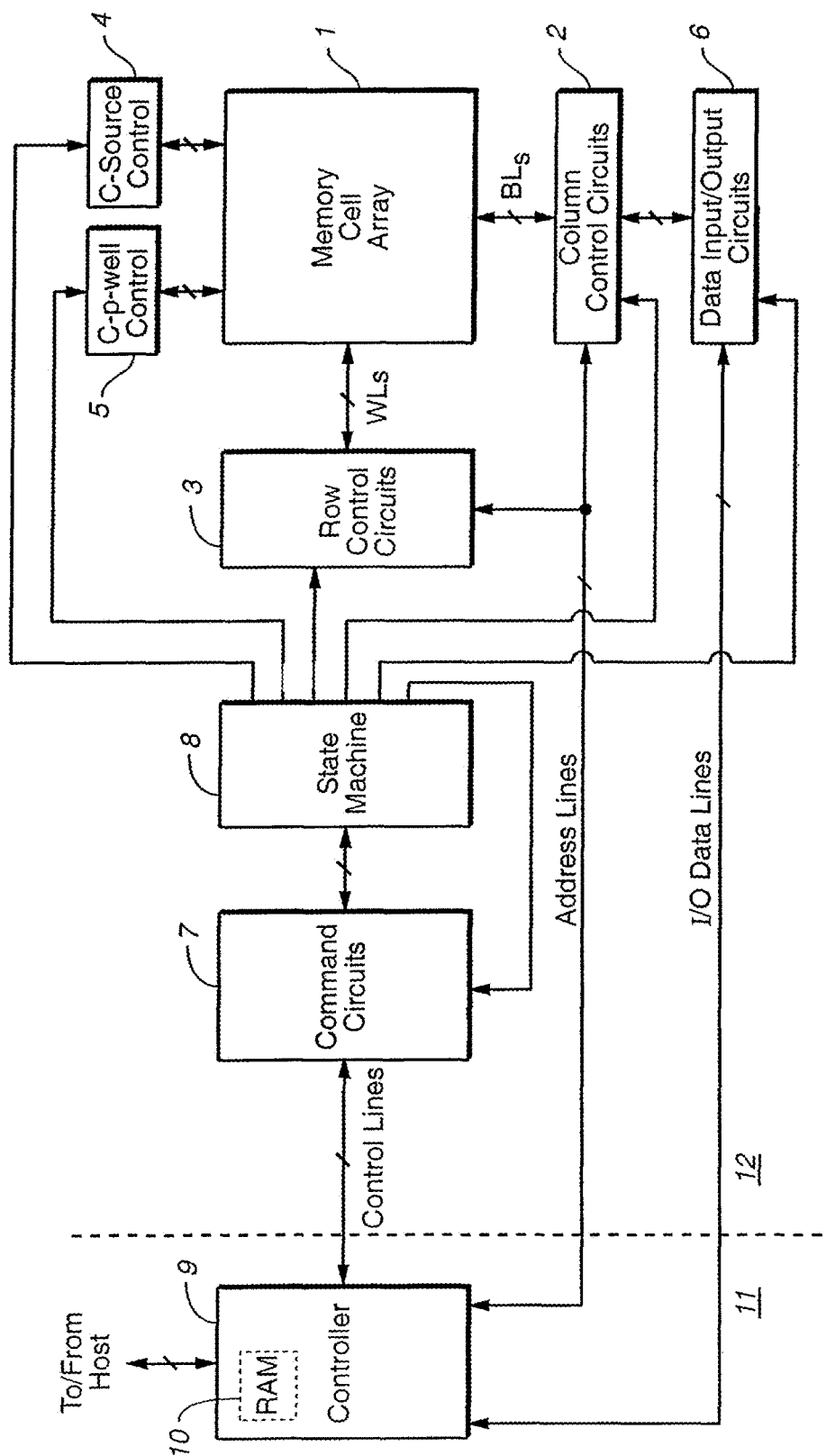
FIG._1 *(Prior Art)*

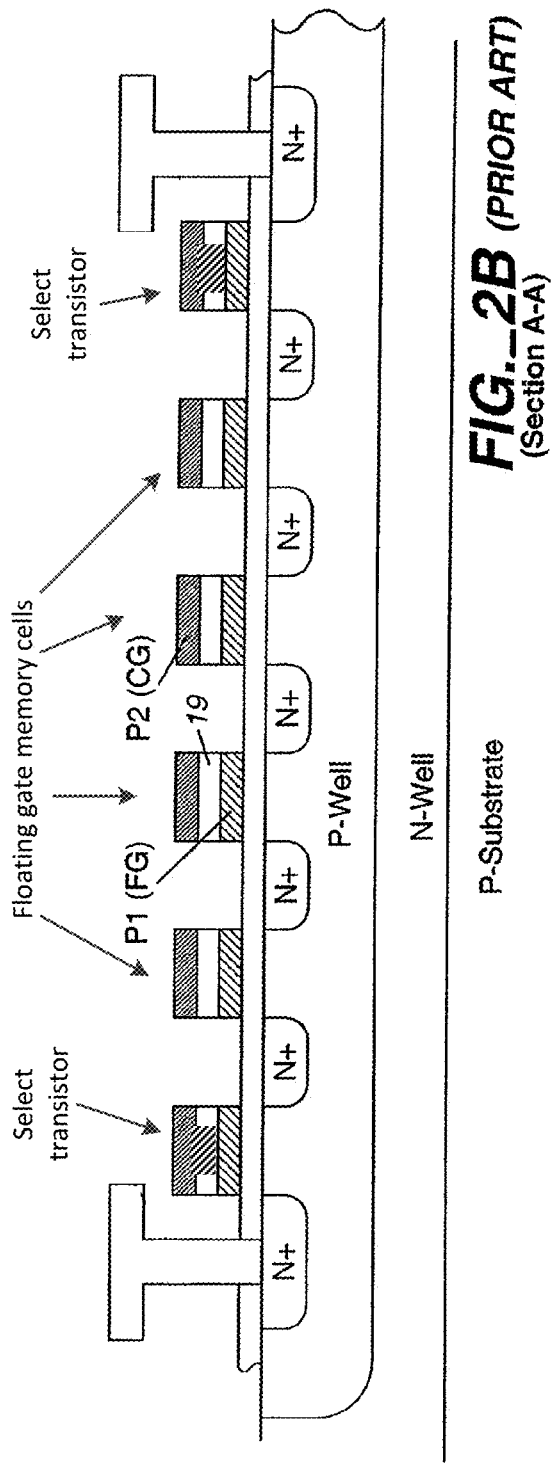
FIG._2B (PRIOR ART)
(Section A-A)

SELF-ALIGNED PROCESS USING VARIABLE-FLUIDITY MATERIAL

BACKGROUND

This application relates generally to integrated circuits (ICs) including non-volatile semiconductor memories of the flash memory type, their formation, structure and use, and to methods of making lines and other features in such ICs.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of the string connect to the bit line and a common source line respectively through select transistors (source select transistor and drain select transistor). Select transistors do not contain floating gates and are used to connect NAND strings to control circuits when they are to be accessed, and to isolate them when they are not being accessed.

Select transistors and peripheral circuits are formed on the same chip as the memory cells but they have very different functions that require different device structures. Thus, a process that is adapted for forming memory cells of a memory array may not be ideal for forming other structures such as select lines and peripheral structures. In general, the cost of manufacturing a memory chip increases with the number of processing steps used, and the number of defective units may tend to increase also. So it is desirable to use the same process steps for both the memory cells and other devices (e.g. select transistors and peripheral circuits).

Thus, there is a need for a memory chip manufacturing process that forms small structures such as memory cells and word lines, and other larger structures such as select transistors and select lines in an efficient manner.

SUMMARY

According to an example of a patterning process, narrow lines such as sidewall spacers may be formed to define a perimeter of a relatively large structure. Subsequently, a portion of variable-fluidity material may be formed within the perimeter defined by the sidewall spacers. Process conditions are then applied to increase the fluidity of the variable-fluidity material thereby causing it to flow and extend to the sidewall spacers. Thus, the variable-fluidity material aligns itself (self-aligning) with the perimeter formed by sidewall spacers when its fluidity is increased. Initial alignment of the variable-fluidity material is not critical because of the later self-alignment when fluidity is increased. Thus, deposition of variable-fluidity material has a high tolerance for misalignment even for very small feature sizes (e.g. where sidewall spacers are some fraction of minimum feature size achievable with direct patterning by photolithography). The amount of variable-fluidity material may be sufficient to cover the area within the perimeter established by sidewall spacers without overflowing the sidewall spacers.

An example of a method of forming a semiconductor device that includes narrow lines and wide lines includes: forming a plurality of line portions arranged on a first layer, a pair of adjacent line portions arranged at a position where a wide line is to be formed; forming a portion of variable-fluidity material between opposing inner walls of the pair of adjacent line portions, the portion of variable-fluidity material patterned to have a lateral dimension that is smaller than a distance between the opposing inner walls of the pair of adjacent line portions; and subsequently applying process conditions that increase the fluidity of the portion of variable-fluidity material sufficiently to cause the portions of variable-fluidity material to extend to the opposing inner walls of the pair of adjacent line portions.

A first volume defined by the portion of variable-fluidity material may be less than a second volume defined by the opposing inner walls of the pair of adjacent line portions on the first layer. The first volume may have a first cross sectional area equal to the lateral dimension multiplied by a height of the portion of variable-fluidity material and the second volume may have a second cross sectional area equal to the distance between the opposing inner walls multiplied by a height of the pair of adjacent line portions, and the first cross sectional area may be less than the second cross sectional area. Subsequently, with flown variable-fluidity material contacting the opposing inner walls of the pair of adjacent line portions, the first layer may be patterned by anisotropic etching to form a wide line defined by the flown variable-fluidity material and the pair of adjacent line portions and forming narrow lines defined by other line portions of the plurality of line portions that are not in contact with the flown variable-fluidity material. Ion implantation may subsequently be performed using the wide lines and narrow lines as an implantation mask. Applying the process conditions may include applying heat to raise the temperature of the portion of variable-fluidity material above room temperature. Applying the process conditions may include exposing the portion of variable-fluidity material to one or more chemical compound that interacts with the portion of variable-fluidity material. The plurality of line portions may be formed as sidewall spacers along sidewalls of mandrels. The lateral dimension may be smaller than the distance between the opposing inner walls of the pair of adjacent line portions by a difference that is sufficient to ensure that the portion of variable-fluidity material does not contact either of the pair of adjacent line portions prior to the applying the process conditions.

An example of a method of forming wide lines and narrow lines in a mask layer includes: forming a mask layer;

forming a pattern of lines on the mask layer, the pattern of lines including a plurality of lines spaced by first gaps where narrow lines are to be formed and a pair of lines spaced by a second gap where a wide line is to be formed, the second gap being wider than the first gaps; subsequently forming a portion of variable-fluidity material in the second gap, the portion of variable-fluidity material patterned to lie within the second gap without contacting either of the pair of lines; subsequently applying process conditions to the portion of variable-fluidity material to increase the fluidity of the variable-fluidity material and cause the variable-fluidity material to flow laterally within the second gap to contact the pair of lines; and subsequently patterning the mask layer by anisotropic etching while the variable-fluidity material remains in the second gap, the pair of lines and the variable-fluidity material in the second gap defining a wide line, the plurality of lines spaced by narrow gaps defining the narrow lines.

The narrow lines may define word lines of a NAND flash memory array and the wide lines may define select lines of the NAND flash memory array. Subsequent to the patterning the mask layer may be patterned by anisotropic etching, the pattern of lines and the variable-fluidity material may be removed; subsequently a stack of underlying layers may be patterned according to the mask layer patterned by the anisotropic etching, the stack of underlying layers including one or more of: a conductive metal layer, a doped polysilicon layer, an interpoly dielectric layer, and a floating gate layer. The variable-fluidity material may be photoresist and forming the portion of variable-fluidity material may include spinning on a layer of photoresist and patterning the photoresist by a photolithographic process. The process conditions may include a temperature that is above twenty one degrees Celsius (21° C.). The portion of variable-fluidity material formed in the second gap may have a volume that is less than a volume in the second gap that is laterally enclosed by the pair of lines so that when the variable-fluidity material flows in the second gap it does not overflow the second gap. The pattern of lines may be formed as sidewall spacers formed on sidewalls of mandrels, the plurality of lines spaced by first gaps formed on sidewalls of narrow mandrels and the pair of lines spaced by the second gap formed on sidewalls of a wide mandrel.

An example of a method of forming word lines and select lines includes: forming a pattern of sidewall spacers on sides of mandrels including a plurality of closely spaced sidewall spacers formed on sides of narrow mandrels in a word line area and a pair of widely spaced sidewall spacers formed on sides of a wide mandrel in a select line area; subsequently removing the mandrels; subsequently forming a portion of variable-fluidity material in the select line area, the portion of variable-fluidity material initially formed in a substantially solid state within a gap that is bounded by the pair of widely spaced sidewall spacers, the portion of variable-fluidity material initially formed so that it is separated from the pair of widely spaced sidewall spacers on either side by at least a minimum distance; subsequently flowing the portion of variable-fluidity material to occupy a bottom surface of the entire gap that is bounded by the pair of widely spaced sidewall spacers; and subsequently patterning at least one underlying layer according to the pattern of sidewall spacers and the portion of variable-fluidity material, with word lines formed where the plurality of closely spaced sidewall spacers are located and select lines formed where the portion of variable-fluidity material lies in the gap that is bounded by the pair of widely spaced sidewall spacers.

Flowing the portion of variable-fluidity material may include applying one or more of: a temperature above room temperature; a chemical that interacts with the variable-fluidity material; electromagnetic radiation; mechanical force; a pressure change to cause a phase change, or ultrasonic vibration. The variable-fluidity material may be an organic material that is applied as a blanket layer and is subsequently patterned. The wide mandrel may occupy a first volume and the portion of variable-fluidity material may have a second volume that is less than the first volume so that the height of variable-fluidity material in the gap that is bounded by the pair of widely spaced sidewall spacers is less than the height of the pair of widely spaced sidewall spacers.

Various aspects, advantages, features and embodiments are included in the following description of examples, which description should be taken in conjunction with the accompanying drawings.

BRIEF DESCRIPTION OF THE DRAWINGS

FIG. 1 is a block diagram of a prior art memory system.
FIG. 2B is a cross section of a NAND string of FIG. 2A.

DETAILED DESCRIPTION OF EXEMPLARY EMBODIMENTS

Memory System

Figure 2A:
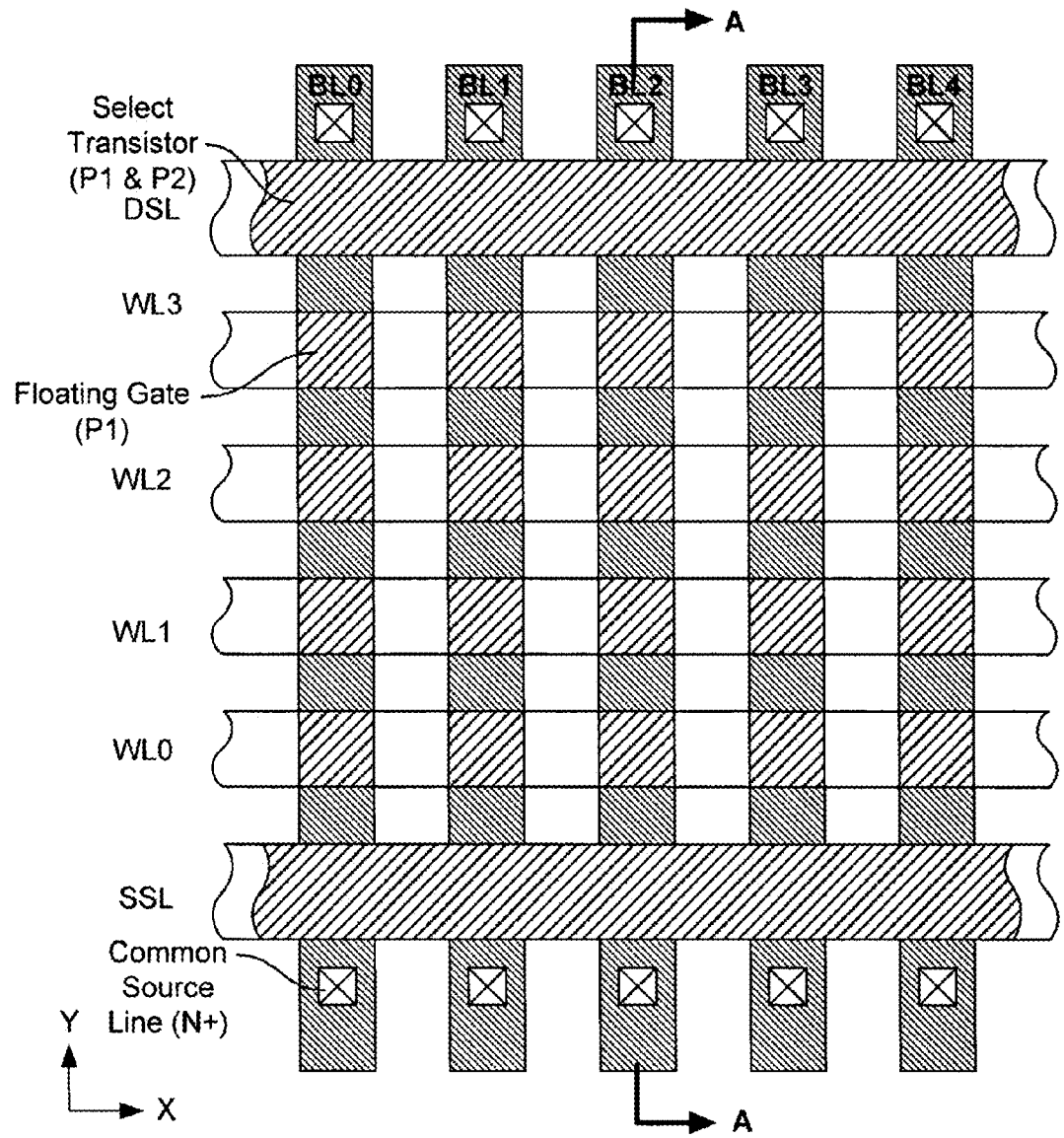
FIG. 2A is a plan view of a prior art NAND array.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

An example of a prior art memory system, which may be modified to include various structures described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertable into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

FIGS. 2A-2B show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual memory cells that are connected in series with select transistors at each end of the NAND string.

In some cases, it is desirable to form certain structures such as select lines and select transistors with larger dimensions than word lines and memory cell transistors. For example, larger select transistors may provide better isolation of unselected NAND strings than smaller transistors would. Transistors and lines in peripheral areas may also be larger than word lines and memory cells. Forming such lines and transistors with larger dimensions presents some problems particularly when forming word lines and memory cells with very small dimensions. It will be understood that word lines and underlying memory cell transistors are generally formed in a common series of process steps in which a stack of layers is etched to form word lines that are self-aligned with memory cells. Similarly, select lines are generally, self-aligned with select transistors and may be formed in the same etch step that forms word lines and memory cells, using a common pattern that has narrow pattern elements for word lines and wide pattern elements for select lines.

In some cases, word lines and memory transistors are formed using sidewall spacers that allow minimum dimensions that are smaller than would be achievable using direct patterning by photolithography. However, sidewall spacers are generally formed having a uniform width (which may be equal to word line width) and forming wider conductive lines (such as select lines) may require additional patterning.

Figure 3:
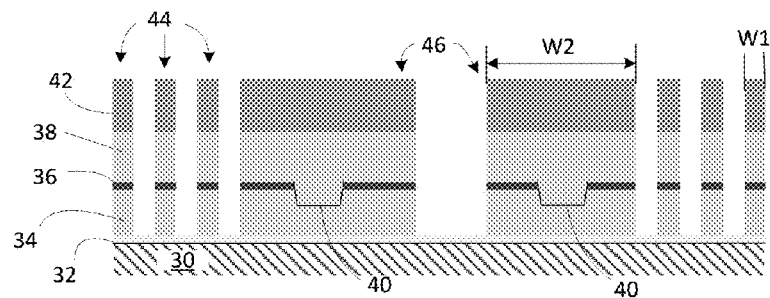
FIG. 3 illustrates an example of a cross section of a NAND string with wide select lines.

FIG. 3 shows a cross section of a portion of a NAND flash memory array at an intermediate stage of fabrication showing the layers of materials (after patterning to form separate memory cells and select transistors) according to an example. The cross-section of FIG. 3 corresponds to FIG. 2A (i.e. cross section along NAND string, A-A in FIG. 2A). A gate dielectric (tunnel dielectric) layer 32 extends along the surface of substrate 30. The gate dielectric layer 32 may be formed of Silicon Dioxide ("oxide") or other suitable dielectric material. A first layer of conductive material 34 overlies gate dielectric layer 32 and is patterned into separate floating gates of memory cells. The first conductive layer 34 may be formed from doped polysilicon and may be referred to as "floating gate polysilicon." A dielectric layer 36 overlies first conductive layer 34. A second conductive layer 38 overlies the dielectric layer 36. The second conductive layer may be formed of doped polysilicon and may be deposited in two deposition steps. The dielectric layer may be referred to as "Inter Poly Dielectric" (IPD) because it is located between polysilicon layers 34 and 38. Openings 40 in dielectric layer 36 allow contact between the first and second polysilicon layers in certain locations. A layer of metal 42 overlies the second polysilicon layer 38. A suitable metal may be Tungsten, with a suitable barrier layer (e.g. Tungsten Nitride or similar layer).

The cross-section of FIG. 3 shows the structure after patterning (e.g. after forming a layer of resist, performing photolithographic patterning of the resist, and performing anisotropic etching such as RIE) to form separate memory cells 44 which each include a floating gate and a control gate. An individual control gate is formed of a portion of second conductive layer 38 and metal layer 42 where they overlie a floating gate formed by a portion of conductive layer 34. The control gate is electrically isolated from the floating gate by a portion of dielectric layer 36 which thus permits some capacitive coupling while preventing current flow between these elements.

In contrast to floating gate memory cells 44, select transistors 46 do not include floating gates. Openings 40 provide electrical contact between floating gate polysilicon layer 34 and control gate polysilicon layer 38 so that a single electrically continuous body is formed that acts as an active gate of the select transistor. Also, the dimensions of select transistors 46 are different to those of memory cell transistors 44. While memory cell transistors 44 have a width W1 (dimension along the bit line direction), select transistors 46 have a greater width W2 in this example. Such larger transistors may allow better control of current through NAND strings, for example, by providing better isolation than a smaller transistor.

Forming both wide and narrow structures, such as select transistors and memory cells, using the same process steps may present certain problems. For example, where sidewall spacers are used to pattern narrow features such as memory cells and word lines, it may be difficult to form larger features using the same process steps. Sidewall spacers are generally formed having a uniform width so that some subsequent processing may be needed to form wider structures that have a width that is greater than the width of a single sidewall spacer.

Figure 4:
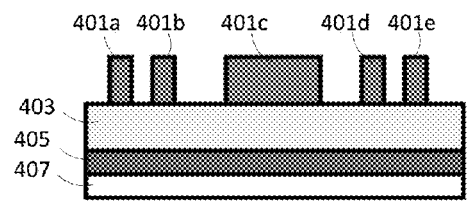
FIG. 4 shows a cross section of a NAND device at an intermediate stage of fabrication.

FIGS. 4-11 illustrate an example of a process in which sidewall spacers are used to form a pattern of word lines and to establish locations of edges of select lines. FIG. 4 shows patterned portions of photoresist 401*a-e* that are formed by conventional photolithographic patterning. The photoresist overlies a sacrificial layer 403, which overlies a hard mask layer 405. These layers may in turn overlie a stack of layers 407 to be patterned (e.g. floating gate poly, IPD, control gate poly, control gate metal, etc.). It will be understood that the underlying layers to be patterned may vary depending on the nature of the integrated circuit being formed.

FIG. 4 shows the structure at an intermediate stage of fabrication with portions of photoresist 401*a-e*. A wide portion of photoresist 401*c* is present in a central area of the structure shown where select lines are to be formed, and narrower portions of photoresist 401*a,b,d,e* are present on either side in areas where word lines are to be formed. The portions of photoresist may be patterned by conventional photolithography. Smaller portions may be formed having the a width that is equal to the minimum feature size achievable with the photolithographic process used (F) and may be spaced apart by a spacing that is equal to the smallest feature size (F).

Figure 5:
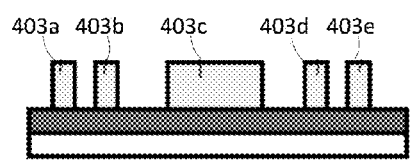
FIG. 5 shows the device of FIG. 4 after formation of mandrels.

FIG. 5 shows the structure after the portions of photoresist 401*a-e* of FIG. 4 are used to pattern underlying sacrificial layer 403 (e.g. silicon oxide). The photoresist portions act as an etch mask so that the pattern is transferred to sacrificial layer 403. This forms mandrels 403*a-e* of the sacrificial material, including a wide mandrel 403*c* in the central area and narrow mandrels 401*a,b,d,e* on either side.

Figure 6:
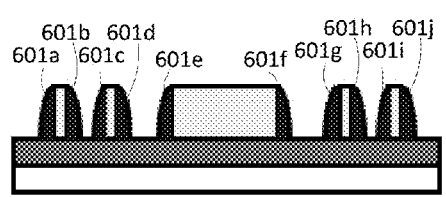
FIG. 6 shows the device of FIG. 5 after formation of sidewall spacers.

FIG. 6 shows the structure of FIG. 5 after slimming of mandrels 403*a-e* (e.g. by isotropic etching) to reduce the widths of mandrels and formation of sidewall spacers 611*a-j*. Slimming may reduce the width of narrow mandrels to less than F (e.g. F/2). Spaces between neighboring mandrels are widened accordingly to be greater than F (e.g. 3F/2). Sidewall spacers 601*a-j* are then formed along sides of slimmed mandrels, e.g. by depositing a blanket layer of sidewall spacer material and etching back to leave sidewall spacers.

Figure 7:
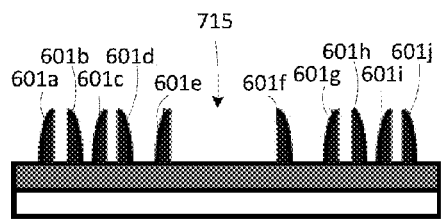
FIG. 7 shows the device of FIG. 6 after removal of mandrels.

FIG. 7 shows the structure of FIG. 6 after removal of mandrels to leave sidewall spacers 601*a-j*. Sidewall spacers 601*a-j* have a width of approximately F/2 in this example. A pair of sidewall spacers 601*e* and 601*f* are separated by a wide gap 715 in the central area where select lines are to be formed. Sidewall spacers 601*a-d*, and 601*g-j* on either side are separated by smaller gaps (approximately F/2 in this example).

Figure 8:
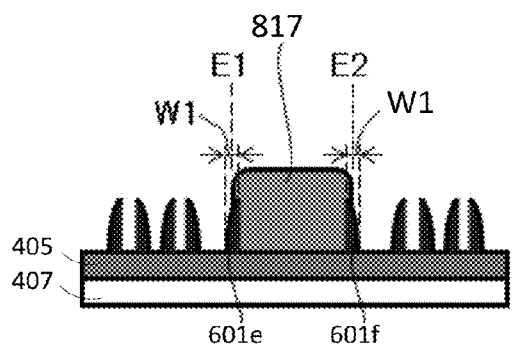
FIG. 8 shows alignment of a second pattern with the sidewall spacers.

FIG. 8 shows subsequent processing to form a photoresist portion 817 in the central area. Another photolithographic process is used to form photoresist portion 817. It can be seen there is little margin for aligning photoresist portion 817. The sidewall spacers have a width W1 (e.g. F/2) and the edges of photoresist portion 817 should be located over sidewall spacers so that the sidewall spacers define the edges of select lines. Thus, edges E1 and E2 of the portion of photoresist should be located within W1/2 (e.g. approximately F/4), of their ideal location over the middle of sidewall spacers S1 and S2.

Figure 9:
FIG. 9 shows the patterning of a hard mask layer according to the pattern of FIG. 8.

FIG. 9 shows the results of subsequent transfer of the pattern of FIG. 8 to underlying hard mask layer 405. Sidewall spacers establish locations of narrow lines in the side areas where word lines are to be formed. Sidewall spacers 601*e*, 601*f* and resist portion 817 establish locations of select lines in the central location.

Figure 10:
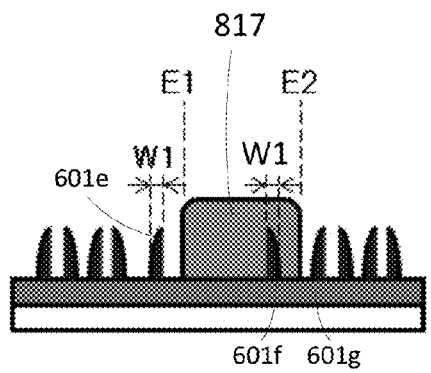
FIG. 10 shows an example of misalignment.
Figure 11:
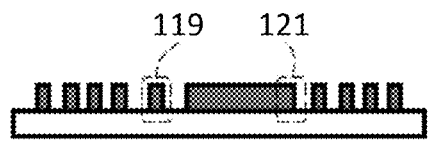
FIG. 11 shows a result of misalignment of FIG. 10.

Misalignment of photoresist portion 817 can have serious consequences. FIG. 10 shows an example where photoresist portion 817 is shifted to the right so that edge E1 is located within the wide gap and edge E2 is located between sidewalls 601*f* and 601*g*. As a result, sidewall 601*e* defines an additional unwanted narrow line 119 (FIG. 11) instead of defining the edge of a wide line. Edge E2 may be too close to the nearest narrow line so that a select line is formed too close to a word line, which may affect electrical characteristics, e.g. causing unacceptable coupling. In some cases photoresist may contact sidewall spacer 601*g* causing a select line and word line to be connected and thus electrically shorted together as shown in FIG. 11 at location 121.

As device dimensions become smaller alignment of patterns becomes harder. For example, aligning a pattern such as photoresist portion with a pattern of sidewall spacers, each approximately F1/2 wide, provides a margin of about F/4 which becomes very hard to achieve as F becomes smaller. Even if such alignment is achievable, it may be costly because of the sophisticated equipment needed for such precision and yield may be low.

FIGS. 12-15 show an alternative approach that does not require precise alignment and thus may enable formation of devices with smaller dimensions, with acceptable yields, and/or at acceptable cost. Formation of sidewall spacers may be performed as before so that sidewall spacers are closely spaced in areas where word lines are to be formed with a pair of sidewall spacers S1 and S2 separated by a wide gap in a central area where select lines are to be formed. In other examples, structures other than select gates (e.g. peripheral transistor or line) may be formed using aspects of the present technique so that there may or may not be additional sidewall spacers on either side. Only sidewalls S1 and S2 are shown to simplify the illustration. It will be understood that additional sidewall spacers may be provided when the present technique is used for formation of select line structures between word lines.

Figure 12A:
FIGS. 12A-B show different views of a device at an intermediate stage of fabrication with two sidewall spacers defining a gap.
Figure 12B:
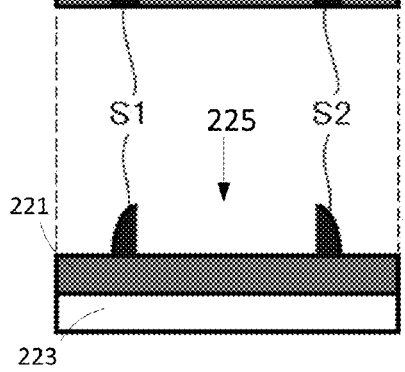

FIG. 12A shows sidewall spacers S1 and S2 in plan view (top-down view) at an intermediate stage of fabrication. FIG. 12B shows a cross-sectional view at the same stage of fabrication, which shows underlying hard mask layer 222 and stack 224. A wide gap 225 is formed between sidewall spacers S1 and S2.

Figure 13A:
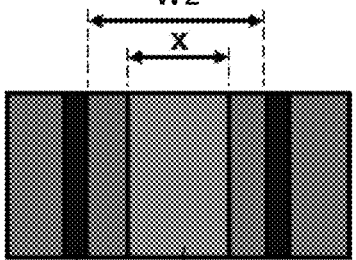
FIGS. 13A-B show the device of FIGS. 12A-B after formation of a portion of variable-fluidity material in the gap.
Figure 13B:
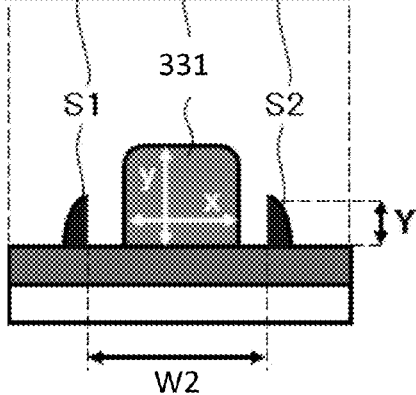

FIGS. 13A-B show the structure of FIGS. 12A-B at a subsequent stage of fabrication after a portion 331 of variable-fluidity material is deposited in the wide gap between sidewall spacers S1 and S2. Unlike the example of FIG. 8, the edges of portion 331 are not precisely aligned with sidewall spacers S1 and S2. Portion 331 may have a width=x that is significantly less than the width of the wide gap W2. The precise location of portion 331 within the wide gap is not critical. Portion 331 may be centered, or may be off-center. Portion 331 may extend close to sidewall spacers S1 and S2, may touch a sidewall, or may be separated from sidewall spacers S1 and S2 by a significant gap or gaps. Portion 331 is shown having a height y that is greater than the height of sidewall spacers Y (in other examples, these may be equal or y may be less than Y). In general, the geometry of portion 331 is chosen so that its cross sectional area x*y is less than the cross sectional area of wide gap 225 between S1 and S2, which has cross sectional area=W2*Y.

Subsequent to the stage illustrated in FIGS. 13A-B, the structure is subject to one or more process steps that modify the fluidity of variable-fluidity material of portion 331. For example, variable-fluidity material may have a melting point above room temperature (approximately twenty one degrees Celsius, 21° C.) so that when the temperature is increased the fluidity increases and the material flows (e.g. the variable-fluidity material may be a solid at room temperature and may melt to become a liquid when temperature is increased). In other examples, the fluidity of the variable-fluidity material may be modified using other process conditions. For example, a chemical reaction may affect fluidity so that a process step to increase fluidity may include exposing the variable-fluidity material to one or more chemical compound (e.g. gasses, and/or liquids). The variable-fluidity material may be exposed to electromagnetic radiation, such as radio frequency (RF) or microwave radiation, ultraviolet (UV) radiation, infrared radiation, x-ray radiation and/or other forms of electromagnetic radiation. A mechanical force may be applied such as a pressing force that reduces the height of the portion and forces it to expand laterally. Pressure may be modified, for example, by changing from high to low pressure so that a phase transition (e.g. from solid to liquid) is induced. Ultrasonic vibration or other mechanical agitation may be applied. One or more of these conditions may be combined, in parallel and/or sequentially. The conditions listed here is not exhaustive and it will be understood that any suitable steps that cause a change in fluidity, causing a material to flow, may be used.

An example of process conditions that increase fluidity of variable-fluidity material may include a Resolution Enhancement Lithography Assisted by Chemical Shrink (RELACS) process. For example, a portion of RELACS material may have its fluidity increased during a RELACS process (e.g. mixing bake step).

Figure 14A:
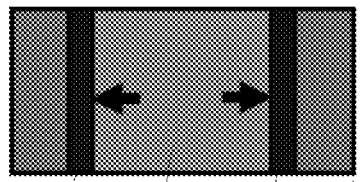
FIGS. 14A-B show the device of FIGS. 13A-B after flowing of variable-fluidity material.
Figure 14B:
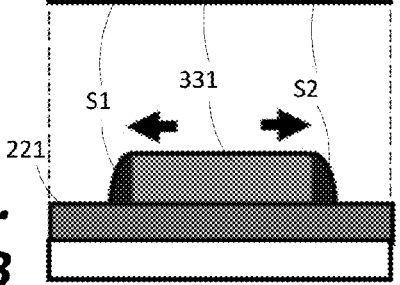

FIGS. 14A-B show the result of increased fluidity of variable-fluidity portion 331. As fluidity is increased the variable-fluidity material flows outwards until it reaches sidewall spacers S1 and S2. Sidewall spacers S1 and S2 act as barriers or dams to stop the now-fluid material from flowing further. Thus, the entire upper surface of hard mask layer 221 in the area within sidewall spacers S1 and S2 is covered in variable-fluidity material portion 331, while none of the variable-fluidity material flows beyond sidewall spacers S1 and S2. Thus, the variable-fluidity material effectively aligns itself with sidewall spacers when it flows outwards (i.e. it becomes self-aligning and does not require a separate alignment step). While the initial alignment of portion 331 may be rough, with a high tolerance for alignment error, the end result after flowing of variable-fluidity material is precise alignment with the sidewall spacer pattern. The result is a continuous masking portion with a perimeter defined by sidewall spacers S1 and S2 and an interior covered with variable-fluidity material portion 331.

In general, the volume of variable material deposited within sidewall spacers S1 and S2 is less than the volume of the wide gap 225 so that the variable-fluidity material does not overflow the perimeter established by sidewall spacers S1 and S2. Where the variable-fluidity material is formed as a continuous strip within a uniform wide gap, this means that the cross sectional area of the strip is less than the cross sectional area of the wide gap (as shown in FIG. 13B). In other examples, the wide gap may not be uniform and/or the variable-fluidity material may be irregular and/or discontinuous. In any case, the volume of variable-fluidity material deposited may sufficient to fully cover the upper surface of the hard mask layer in the wide gap while being sufficiently small so that it does not overflow the wide gap. Thus, the volume of variable-fluidity material is generally less than the volume enclosed by sidewall spacers, i.e. less than the volume of the mandrel that formerly occupied the gap. In some cases, variable-fluidity material may be deposited with a first height and then etched back to a lower second height in order to reduce the volume of variable-fluidity material to an appropriate amount. While FIG. 14B shows the height of variable-fluidity material portion 331 being equal to the height of the sidewall spacers S1 and S2, it may be somewhat lower to ensure that there is no risk of overflowing.

Suitable materials for variable-fluidity material include organic materials such as photoresist. Photoresist may be spun-on and patterned to form a portion of variable-fluidity material which is substantially solid at room temperature. Subsequently, the temperature may be increased above room temperature, e.g. to about two hundred degrees Celsius (200° C.). For example, a silicon wafer to be processed using this technique may be placed in a furnace, or subject to Rapid Thermal Anneal (RTA) or may otherwise have its temperature elevated for some period causing the photoresist to flow. Subsequently, the photoresist may return to a substantially solid state when temperature is reduced.

Figure 15A:
FIGS. 15A-B show the device of FIGS. 14A-B after patterning of an underlying layer.
Figure 15B:
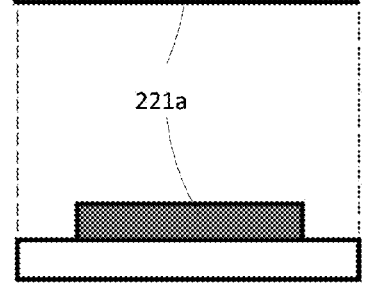

FIGS. 15A-B show a patterned portion of hard mask material 221a that is patterned from hard mask layer 221 using sidewall spacers S1 and S2, connected by variable-fluidity material portion 331. Sidewall spacers S1 and S2 with variable-fluidity material portion 331 define an area where, for example, select lines may be formed. The perimeter of this area is defined by sidewalls S1 and S2 and the process has a high tolerance for misalignment of variable-fluidity material within sidewalls S1 and S2. It will be understood that sidewalls S1 and S2 may be formed along opposing sides of a single wide mandrel and may be considered as portions of a single sidewall spacer that extends around the perimeter of a wide mandrel initially, and later forms an enclosure that retains variable-fluidity material in the space previously occupied by the wide mandrel. While a particular application of this technique may be applied to formation of select lines and word lines, it will be understood that flowing variable-fluidity material within a predefined area may be applied to a variety of different applications and is not limited to formation of select line structures, or to NAND memory devices. Hard mask material portion 221a may be used to define a wide structure. For example, subsequent anisotropic etching may be performed to transfer the pattern of portion 221a to underlying layers. Hard mask material portion 221a may also be used as a mask during ion implantation. For example, after anisotropic etching, ion implantation may implant a dopant into exposed areas of the substrate.

Figure 16:
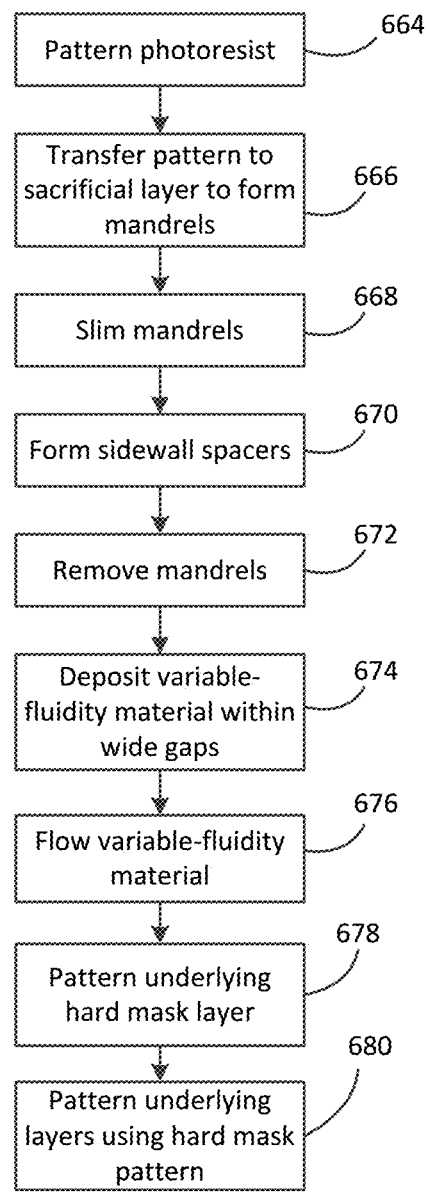
FIG. 16 shows an example of process steps used to form wide and narrow lines.

FIG. 16 shows an example of a series of process steps that may be used to form wide pattern portions in combination with narrow pattern portions such as sidewall spacers. A photoresist layer is formed and patterned 664. This pattern may include narrow lines of photoresist and one or more wide lines. The pattern is then transferred to an underlying sacrificial layer to form mandrels 666 including a wide mandrel where a wide line of photoresist was formed. Mandrels are then slimmed 668. Sidewalls are formed along sides of mandrels 670, e.g. by depositing a blanket layer and performing anisotropic etching. Mandrels are then removed 672 to leave wide gaps where wide mandrels were removed.

Variable-fluidity material (e.g. organic material such as photoresist) is then deposited within wide gaps 674. This step is generally tolerant of misalignment and does not require high precision. Process conditions are then applied to cause the variable-fluidity material to flow 676, e.g. by raising the temperature causing a substantially solid material to become substantially liquid and flow. The volume of variable-fluidity material is sufficient to cover bottom of wide gaps without overflowing the sidewall spacers. The resulting pattern of sidewall spacers and variable-resist material is used to pattern an underlying hard mask layer 678. The hard mask layer may in turn be used to pattern underlying layers 680 such as a stack of layers forming a memory array. The hard mask layer may also be used as an implant mask when implanting exposed areas of the substrate.

CONCLUSION

Although the various aspects have been described with respect to exemplary embodiments, it will be understood that protection within the full scope of the appended claims is appropriate.

It is claimed:

1. A method of forming a semiconductor device that includes narrow lines and wide lines, the method comprising:
   forming a plurality of line portions arranged on a first layer, a pair of adjacent line portions arranged at a position where a wide line is to be formed;
   forming a portion of variable-fluidity material between opposing inner walls of the pair of adjacent line portions, the portion of variable-fluidity material patterned to have a lateral dimension that is smaller than a distance between the opposing inner walls of the pair of adjacent line portions; and
   subsequently applying process conditions that increase the fluidity of the portion of variable-fluidity material sufficiently to cause the portion of variable-fluidity material to extend to the opposing inner walls of the pair of adjacent line portions.

2. The method of claim 1 wherein a first volume defined by the portion of variable-fluidity material is less than a second volume defined by the opposing inner walls of the pair of adjacent line portions on the first layer.

3. The method of claim 2 wherein the first volume has a first cross sectional area equal to the lateral dimension multiplied by a height of the portion of variable-fluidity material and the second volume has a second cross sectional area equal to the distance between the opposing inner walls multiplied by a height of the pair of adjacent line portions, and the first cross sectional area is less than the second cross sectional area.

4. The method of claim 1 further comprising: subsequently, with flown variable-fluidity material contacting the opposing inner walls of the pair of adjacent line portions, patterning the first layer by anisotropic etching to form a wide line defined by the flown variable-fluidity material and the pair of adjacent line portions and forming narrow lines defined by other line portions of the plurality of line portions that are not in contact with the flown variable-fluidity material.

5. The method of claim 4 further comprising subsequently performing ion implantation using the wide lines and narrow lines as an implantation mask.

6. The method of claim 1 wherein applying the process conditions includes applying heat to raise the temperature of the portion of variable-fluidity material above room temperature.

7. The method of claim 1 wherein applying the process conditions includes exposing the portion of variable-fluidity material to one or more chemical compound that interacts with the portion of variable-fluidity material.

8. The method of claim 1 wherein the plurality of line portions are formed as sidewall spacers along sidewalls of mandrels.

9. The method of claim 8 wherein the lateral dimension is smaller than the distance between the opposing inner walls of the pair of adjacent line portions by a difference that is sufficient to ensure that the portion of variable-fluidity material does not contact either of the pair of adjacent line portions prior to the applying the process conditions.

10. A method of forming wide lines and narrow lines in a mask layer comprising:
    forming a mask layer;
    forming a pattern of lines on the mask layer, the pattern of lines including a plurality of lines spaced by first gaps where narrow lines are to be formed and a pair of lines spaced by a second gap where a wide line is to be formed, the second gap being wider than the first gaps;
    subsequently forming a portion of variable-fluidity material in the second gap, the portion of variable-fluidity material patterned to lie within the second gap without contacting either of the pair of lines;
    subsequently applying process conditions to the portion of variable-fluidity material to increase the fluidity of the variable-fluidity material and cause the variable-fluidity material to flow laterally within the second gap to contact the pair of lines; and
    subsequently patterning the mask layer by anisotropic etching while the variable-fluidity material remains in the second gap, the pair of lines and the variable-fluidity material in the the second gap defining the wide line, the plurality of lines spaced by narrow gaps defining the narrow lines.

11. The method of claim 10 wherein the narrow lines define word lines of a NAND flash memory array and the wide lines define select lines of the NAND flash memory array.

12. The method of claim 11 further comprising:
    subsequent to the patterning the mask layer by anisotropic etching, removing the pattern of lines and the variable-fluidity material;
    subsequently patterning a stack of underlying layers according to the mask layer patterned by the anisotropic etching, the stack of underlying layers including one or more of: a conductive metal layer, a doped polysilicon layer, an interpoly dielectric layer, and a floating gate layer.

13. The method of claim 10 wherein the variable-fluidity material is photoresist and the forming the portion of variable-fluidity material comprises spinning on a layer of photoresist and patterning the photoresist by a photolithographic process.

14. The method of claim 13 wherein the process conditions include a temperature that is above twenty one degrees Celsius (21° C.).

15. The method of claim 10 wherein the portion of variable-fluidity material formed in the second gap has a volume that is less than a volume in the second gap that is laterally enclosed by the pair of lines so that when the variable-fluidity material flows in the second gap it does not overflow the second gap.

16. The method of claim 10 wherein the pattern of lines is formed as sidewall spacers formed on sidewalls of mandrels, the plurality of lines spaced by first gaps formed on sidewalls of narrow mandrels and the pair of lines spaced by the second gap formed on sidewalls of a wide mandrel.

17. A method of forming word lines and select lines comprising:
   forming a pattern of sidewall spacers on sides of mandrels including a plurality of closely spaced sidewall spacers formed on sides of narrow mandrels in a word line area and a pair of widely spaced sidewall spacers formed on sides of a wide mandrel in a select line area;
   subsequently removing the mandrels;
   subsequently forming a portion of variable-fluidity material in the select line area, the portion of variable-fluidity material initially formed in a substantially solid state within a gap that is bounded by the pair of widely spaced sidewall spacers, the portion of variable-fluidity material initially formed so that it is separated from the pair of widely spaced sidewall spacers on either side by at least a minimum distance;
   subsequently flowing the portion of variable-fluidity material to occupy a bottom surface of the entire gap that is bounded by the pair of widely spaced sidewall spacers; and
   subsequently patterning at least one underlying layer according to the pattern of sidewall spacers and the portion of variable-fluidity material, with word lines formed where the plurality of closely spaced sidewall spacers are located and select lines formed where the portion of variable-fluidity material lies in the gap that is bounded by the pair of widely spaced sidewall spacers.

18. The method of claim 17 wherein the flowing the portion of variable-fluidity material includes applying one or more of: a temperature above room temperature; a chemical that interacts with the variable-fluidity material; electromagnetic radiation; mechanical force; a pressure change to cause a phase change, or ultrasonic vibration.

19. The method of claim 17 wherein the variable-fluidity material is an organic material that is applied as a blanket layer and is subsequently patterned.

20. The method of claim 17 wherein the wide mandrel occupies a first volume and the portion of variable-fluidity material has a second volume that is less than the first volume so that the height of variable-fluidity material in the gap that is bounded by the pair of widely spaced sidewall spacers is less than the height of the pair of widely spaced sidewall spacers.

* * * * *